(12) United States Patent
Takakuwa (10) Patent No.: US 10,627,726 B2
(45) Date of Patent: Apr. 21, 2020

(54) PATTERNING SUPPORT SYSTEM, PATTERNING METHOD, AND NONVOLATILE RECORDING MEDIUM

(71) Applicant: TOSHIBA MEMORY CORPORATION, Minato-ku (JP)

(72) Inventor: Manabu Takakuwa, Tsu (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/291,371

(22) Filed: Mar. 4, 2019

(65) Prior Publication Data
US 2020/0019073 A1 Jan. 16, 2020

(30) Foreign Application Priority Data
Jul. 10, 2018 (JP) .................................. 2018-130773

(51) Int. Cl.
*G03B 27/42* (2006.01)
*G03F 7/20* (2006.01)

(52) U.S. Cl.
CPC ...... *G03F 7/70775* (2013.01); *G03F 7/70516* (2013.01)

(58) Field of Classification Search
CPC ............ G03F 7/70775; G03F 7/70116; G03F 9/7088; G03F 7/20; G03F 7/70275; G03F 7/7085; G03F 9/7011; G03F 7/707; G03F 9/70; G03F 9/7019; G03F 9/7084; G03F 7/70683; G03F 9/7015; G03F 9/7069; G03F 9/7076; G03F 7/70383; G03F 7/70866; G03F 9/7046; G03B 27/32; G03B 27/58
See application file for complete search history.

(56) References Cited

U.S. PATENT DOCUMENTS

2002/0145716 A1* 10/2002 Kurosawa ........... G03F 7/70358
355/55
2018/0039191 A1 2/2018 Shibazaki

FOREIGN PATENT DOCUMENTS

| JP | 7-183214 | 7/1995 |
|---|---|---|
| JP | 2006-086163 | 3/2006 |
| JP | 2014-092397 | 5/2014 |
| WO | WO 2016/136689 A1 | 9/2016 |

\* cited by examiner

*Primary Examiner* — Mesfin T Asfaw
(74) *Attorney, Agent, or Firm* — Oblon, McClelland, Maier & Neustadt, L.L.P.

(57) ABSTRACT

According to one embodiment, a patterning support system includes an absolute position measuring device that measures absolute positions with respect to absolute coordinates, of a first pattern formed in a shot area of a substrate and a second pattern to be transferred to the substrate while being overlayed on the first pattern, a substrate profile measuring device that measures a global positional deviation amount of the substrate, a misalignment inspecting device that measures a misalignment amount of the second pattern with respect to the first pattern, a correction executing device that corrects the position of the second pattern with respect to the first pattern, and a control device that calibrates the absolute positions measured by the absolute position measuring device, using at least one of the global positional deviation amount and the misalignment amount, and converts the calibrated absolute positions into a position correction parameter to be used when the position of the second pattern is corrected by the correction executing device.

16 Claims, 8 Drawing Sheets

PATTERNING SUPPORT SYSTEM, PATTERNING METHOD, AND NONVOLATILE RECORDING MEDIUM

CROSS-REFERENCE TO RELATED APPLICATIONS

This application is based upon and claims the benefit of priority from Japanese Patent Application No. 2018-130773, filed on Jul. 10, 2018; the entire contents of which are incorporated herein by reference.

FIELD

Embodiments described herein relate generally to a patterning support system, a patterning method, and a nonvolatile recording medium.

BACKGROUND

A patterning device such as an exposure device divides a substrate into a plurality of shot areas, and transfers a pattern of an original to the substrate for each of the shot areas. At this time, a technology of performing alignment of each shot area is known.

In recent years, high stacking of semiconductor devices has been advanced. Positional deviation of a pattern may occur in the shot area due to an influence of stress by high stacking. Such positional deviation cannot be coped with by the above-described alignment technology of each shot area.

DETAILED DESCRIPTION

A patterning support system of an embodiment is applied to patterning of dividing a substrate into a plurality of shot areas and transferring a pattern from an original to the substrate for each of the shot areas, and the patterning support system includes an absolute position measuring device that measures absolute positions with respect to absolute coordinates, of a first pattern formed in the shot area of the substrate and a second pattern to be transferred to the substrate while being overlayed on the first pattern, a substrate profile measuring device that measures a global positional deviation amount of the substrate, a misalignment inspecting device that measures a misalignment amount of the second pattern with respect to the first pattern, a correction executing device that corrects the position of the second pattern with respect to the first pattern, and a control device that calibrates the absolute positions measured by the absolute position measuring device, using at least one of the global positional deviation amount and the misalignment amount, and converts the calibrated absolute positions into a position correction parameter to be used when the position of the second pattern is corrected by the correction executing device.

Hereinafter, the present invention will be described in detail with reference to the drawings. Note that the present invention is not limited by the following embodiment. Further, constituent elements in the following embodiment include those easily assumed by those skilled in the art or those substantially the same.

First Embodiment

A patterning support system, a patterning method, and a nonvolatile recording medium of a first embodiment will be described with reference to FIGS. 1 to 7.

(Configuration Example of Patterning Support System)

Figure 1:
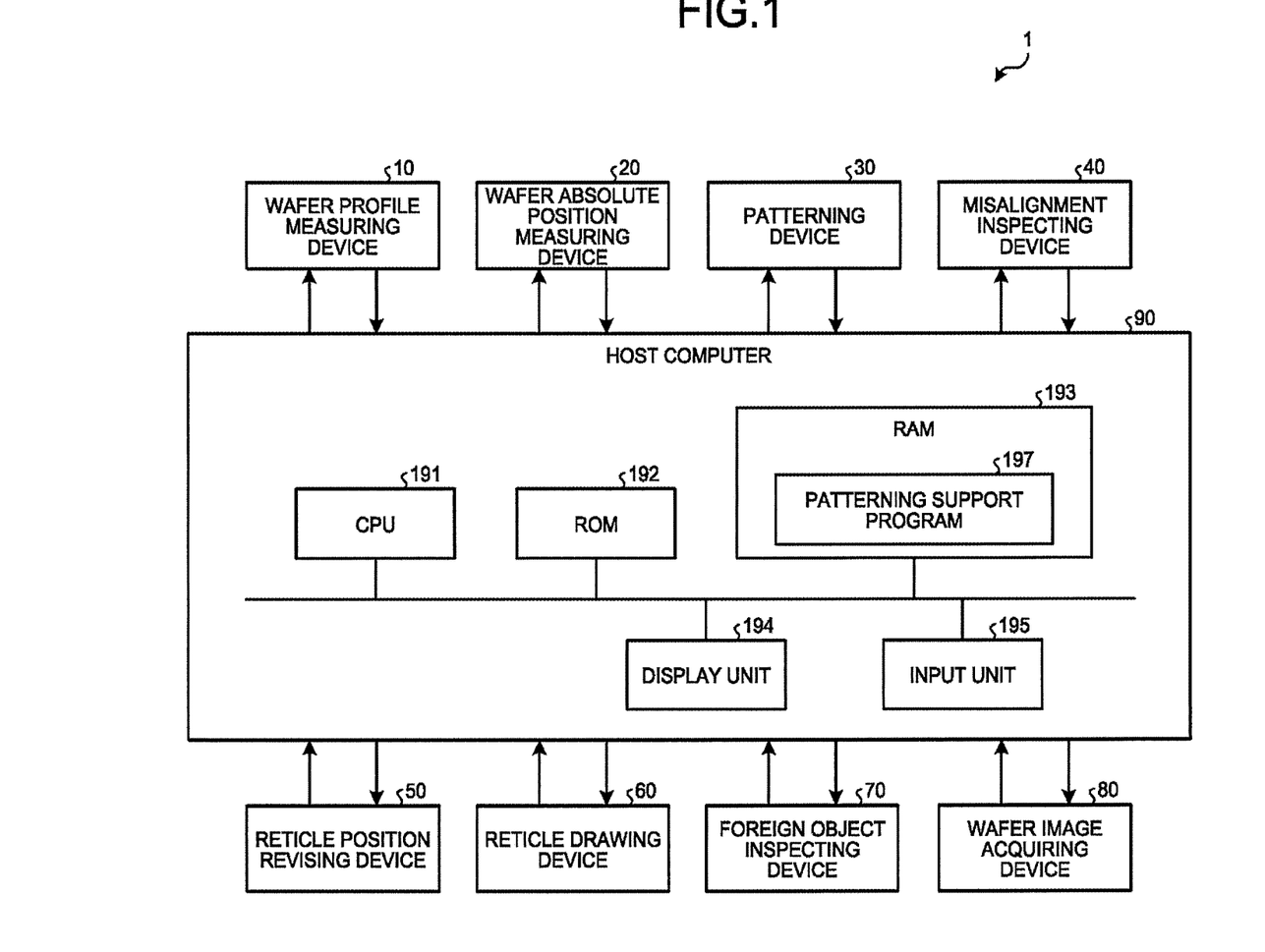
FIG. 1 is a block diagram illustrating a schematic configuration of a patterning support system according to a first embodiment.

FIG. 1 is a block diagram illustrating a schematic configuration of a patterning support system 1 according to the first embodiment. As illustrated in FIG. 1, the patterning support system 1 includes a wafer profile measuring device 10, a wafer absolute position measuring device 20, a patterning device 30, a misalignment inspecting device 40, a reticle position revising device 50, a reticle drawing device 60, a foreign object inspecting device 70, a wafer image acquiring device 80, and a host computer 90. The wafer profile measuring device 10, the wafer absolute position measuring device 20, the patterning device 30, the misalignment inspecting device 40, the reticle position revising device 50, the reticle drawing device 60, the foreign object inspecting device 70, and the wafer image acquiring device 80 are connected with the host computer 90 in a data exchangeable manner.

The wafer profile measuring device 10 measures a profile of a wafer as a substrate to be patterned, using, for example, an atomic force surface topography measuring method, spectroscopic ellipsometry, shearing interference, Fizeau interference, or the like. The wafer profile measuring device 10 can measure data of at least one of height distribution of a wafer surface, nanotopography of the wafer surface, and stress distribution of the wafer surface, as the profile of the wafer. The wafer profile measuring device 10 transmits the measured data to the host computer 90.

The wafer absolute position measuring device 20 measures a coordinate position in absolute coordinates, of a predetermined position of the wafer, using, for example, an interferometer. The position measured by the wafer absolute position measuring device 20 is hereinafter also referred to as an absolute position of the wafer. The wafer absolute position measuring device 20 transmits the measured data to the host computer 90.

The patterning device 30 as a correction executing device is configured as, for example, an exposure device. The patterning device 30 divides the wafer into a plurality of shot areas, and projects a pattern of a reticle (original) onto the wafer by a projection optical system for each shot area, thereby transferring the pattern of the reticle onto the wafer. The patterning device 30 receives a position correction parameter from the host computer 90 and performs patterning for each shot area while correcting a wafer position on the basis of the position correction parameter.

The misalignment inspecting device 40 measures misalignment between patterns of when the wafer is patterned a plurality of times, using a microscope or the like with an image pickup device. The misalignment inspecting device 40 transmits the measured data to the host computer 90.

The reticle position revising device 50 as a correction executing device revises a pattern position in the reticle as the original. The pattern position in the reticle is revised, for example, by locally irradiating the reticle with laser to locally distort the reticle. At this time, the reticle position revising device 50 receives the position correction parameter from the host computer 90, and revises the pattern position on the basis of the position correction parameter.

The reticle drawing device 60 as a correction executing device draws on a glass substrate with an electron beam or the like to produce a reticle. At this time, the reticle drawing device 60 receives the position correction parameter from the host computer 90, and draws the reticle on the basis of the position correction parameter.

The foreign object inspecting device 70 detects a foreign object on the wafer by laser irradiation, image analysis, or the like. The foreign object inspecting device 70 transmits the measured data to the host computer 90.

The wafer image acquiring device 80 acquires a front surface image of the wafer, and detects a defect or the like of the pattern formed on the wafer. The wafer image acquiring device 80 transmits the measured data to the host computer 90.

The host computer 90 as a control device calculates a positional deviation amount within the shot area of the wafer on the basis of the data measured by the wafer profile measuring device 10, the wafer absolute position measuring device 20, the misalignment inspecting device 40, and the like, and generates a position correction parameter from the positional deviation amount.

The host computer 90 has, for example, a central processing unit (CPU) 191, a read only memory (ROM) 192, a random access memory (RAM) 193, a display unit 194, and an input unit 195. In the host computer 90, the CPU 191, the ROM 192, the RAM 193, the display unit 194, and the input unit 195 are connected via a bus line.

The CPU 191 supports patterning on the wafer such as position correction between a plurality of patterns, using a patterning support program 197 that is a computer program. The patterning support program 197 is a computer-executable computer program product having a computer-readable recording medium including a plurality of commands for calculating the position correction parameter necessary for position correction between patterns. In the patterning support program 197, the plurality of commands causes a computer to execute position correction parameter calculation processing.

The display unit 194 is a display device such as a liquid crystal monitor, and displays a status of each device, measurement data, and the like on the basis of an instruction from the CPU 191. The input unit 195 includes a mouse and/or a keyboard, and inputs instruction information externally input by a user. The instruction information input to the input unit 195 is sent to the CPU 191.

The patterning support program 197 is stored in the ROM 192 and loaded into the RAM 193 via the bus line. FIG. 1 illustrates a state in which the patterning support program 197 is loaded in the RAM 193.

The CPU 191 executes the patterning support program 197 loaded in the RAM 193. Specifically, in the host computer 90, the CPU 191 reads the patterning support program 197 from the ROM 192 according to the instruction input from the input unit 195 by the user, expands the program in a program storage area in the RAM 193, and executes various types of processing. The CPU 191 temporarily stores various data generated in the various types of processing in a data storage area formed in the RAM 193.

The patterning support program 197 executed by the host computer 90 has a module configuration including an arithmetic unit and the like, and the modules are loaded and generated on a main storage device.

(Functional Configuration Example of Host Computer)

Figure 2:
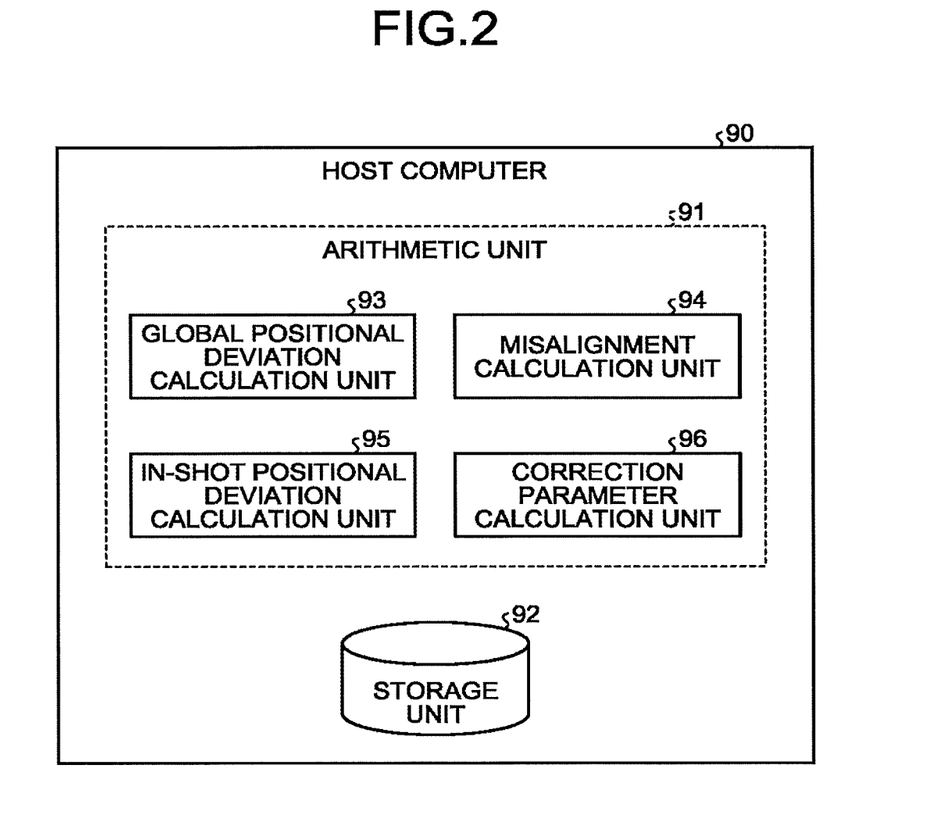
FIG. 2 is a block diagram illustrating functions of a host computer according to the first embodiment.

FIG. 2 is a block diagram illustrating functions of the host computer 90 according to the first embodiment. As illustrated in FIG. 2, the host computer 90 functionally conceptually includes an arithmetic unit 91 and a storage unit 92. The arithmetic unit 91 and the storage unit 92 may be realized by the CPU 191 executing a program or may be realized by a dedicated hardware circuit irrespective of the example in FIG. 1. Further, the storage unit 92 may be realized by an HDD or the like.

The arithmetic unit 91 includes a global positional deviation calculation unit 93, a misalignment calculation unit 94, an in-shot positional deviation calculation unit 95, and a correction parameter calculation unit 96.

The global positional deviation calculation unit 93 calculates a global positional deviation amount over the entire wafer from wafer height data, nanotopography data, stress data, and the like measured by the wafer profile measuring device 10. At this time, the global positional deviation calculation unit 93 may refer to the data of the foreign object inspecting device 70 and the wafer image acquiring device 80.

The misalignment calculation unit 94 calculates a misalignment amount between patterns of when the wafer is patterned a plurality of times on the basis of the data measured by the wafer profile measuring device 10 and the misalignment inspecting device 40. At this time, the misalignment calculation unit 94 may refer to the data of the foreign object inspecting device 70 and the wafer image acquiring device 80.

The in-shot positional deviation calculation unit 95 calculates the positional deviation amount in the shot area on the basis of the data measured by the wafer profile measuring device 10, the wafer absolute position measuring device 20, and the misalignment inspecting device 40. In this case, the in-shot positional deviation calculation unit 95 may refer to the data of the foreign object inspecting device 70 and the wafer image acquiring device 80.

The correction parameter calculation unit 96 calculates the position correction parameter from the positional deviation amount in the shot area. The position correction parameter is a parameter usable by the patterning device 30, the reticle position revising device 50, or the reticle drawing device 60.

The storage unit 92 stores various data measured by the wafer profile measuring device 10, the wafer absolute position measuring device 20, the misalignment inspecting device 40, the foreign object inspecting device 70, and the wafer image acquiring device 80. Further, the storage unit 92 stores various positional deviation amounts and position correction parameters calculated by the host computer 90.

Note that the functional configuration of the host computer 90 is not limited to the configuration illustrated in FIG. 2. For example, the host computer 90 has a function to check wafer information and lot information, and the like, in addition to the above functions. Further, for example, the host computer 90 has a function to grasp the status of each of the devices 10 to 80 connected to the host computer 90.

(Outline of Patterning Position Correction Procedure)

Figure 3:
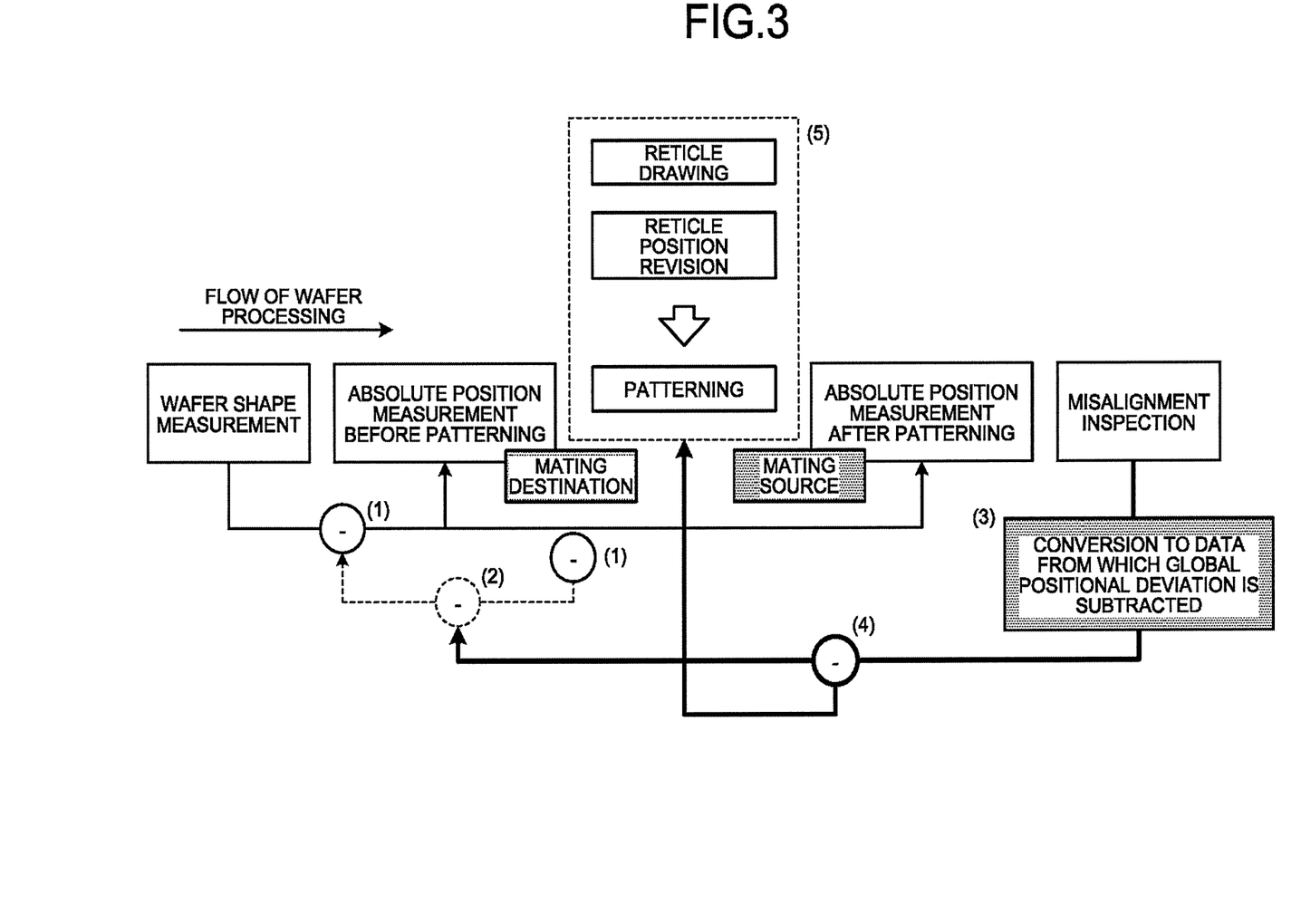
FIG. 3 is a diagram illustrating an outline of a patterning position correction procedure in the patterning support system according to the first embodiment.

Next, an outline of a patterning position correction procedure in the patterning support system 1 will be described with reference to FIG. 3. FIG. 3 is a diagram illustrating an outline of a patterning position correction procedure in the patterning support system 1 according to the first embodiment. The numbers in parentheses in FIG. 3 represent the order of the procedure.

The patterning support system 1 corrects the positional deviation in the shot area in a case of forming a second pattern on the wafer on which a first pattern has been formed in the shot area while overlaying the second pattern on the first pattern. In the following description, assume that the first pattern has already been formed in the shot area of the wafer. Further, thereafter, the first pattern may be referred to as a mating destination and the second pattern may be referred to as a mating source.

As illustrated in FIG. 3, first, a wafer as a transferred substrate is measured by the wafer profile measuring device 10. The global positional deviation calculation unit 93 of the host computer 90 calculates a global positional deviation amount (Gl) on the wafer from the data obtained by the wafer profile measuring device 10.

Next, the wafer absolute position measuring device 20 measures a predetermined position in the shot area of the wafer before and after second pattern formation. The in-shot positional deviation calculation unit 95 of the host computer 90 subtracts the global positional deviation amount (Gl) from an absolute position (Ab) of the wafer before second pattern formation to obtain data (Sb). Further, the in-shot positional deviation calculation unit 95 subtracts the global positional deviation amount (Gl) from an absolute position (Aa) of the wafer after second pattern formation to obtain data (Sa). Further, the in-shot positional deviation calculation unit 95 obtains a difference between the data (Sb) and (Sa) and sets the difference as a provisional positional deviation amount (St1) in the shot area.

Next, the misalignment inspecting device 40 measures the wafer after second pattern formation. The misalignment inspecting device 40 obtains a deviation amount between the first pattern and the second pattern from the measurement result, and sets the deviation amount as a provisional misalignment amount (Ms1). The misalignment calculation unit 94 of the host computer 90 subtracts the global positional deviation amount (Gl) from the provisional misalignment amount (Ms1) to obtain data, and sets the data as a formal misalignment amount (Ms2).

Next, the in-shot positional deviation calculation unit 95 subtracts the misalignment amount (Ms2) from the provisional positional deviation amount (St1) in the shot area to obtain data, and sets the data as a formal positional deviation amount (St2) in the shot area.

The correction parameter calculation unit 96 of the host computer 90 obtains a position correction parameter (Pr) usable in the patterning device 30, the reticle position revising device 50, or the reticle drawing device 60 from the positional deviation amount (St2) in the shot area.

The host computer 90 transmits the position correction parameter (Pr) to at least one of the patterning device 30, the reticle position revising device 50, and the reticle drawing device 60 to cause the patterning device 30, the reticle position revising device 50, or the reticle drawing device 60 to correct the positional deviation in the shot area.

Thereby, the patterning device 30 can immediately reflect the position correction parameter (Pr) in the wafer that is next processed in the exposure processing or in the exposure processing for the next shot area in the water that has acquired the positional deviation amount. Further, the reticle position revising device 50 and the reticle drawing device 60 can reflect the position correction parameter (Pr) at the time of lot processing after revising or producing a reticle.

(Example of Positional Deviation Correction by Patterning Device)

Figure 4:
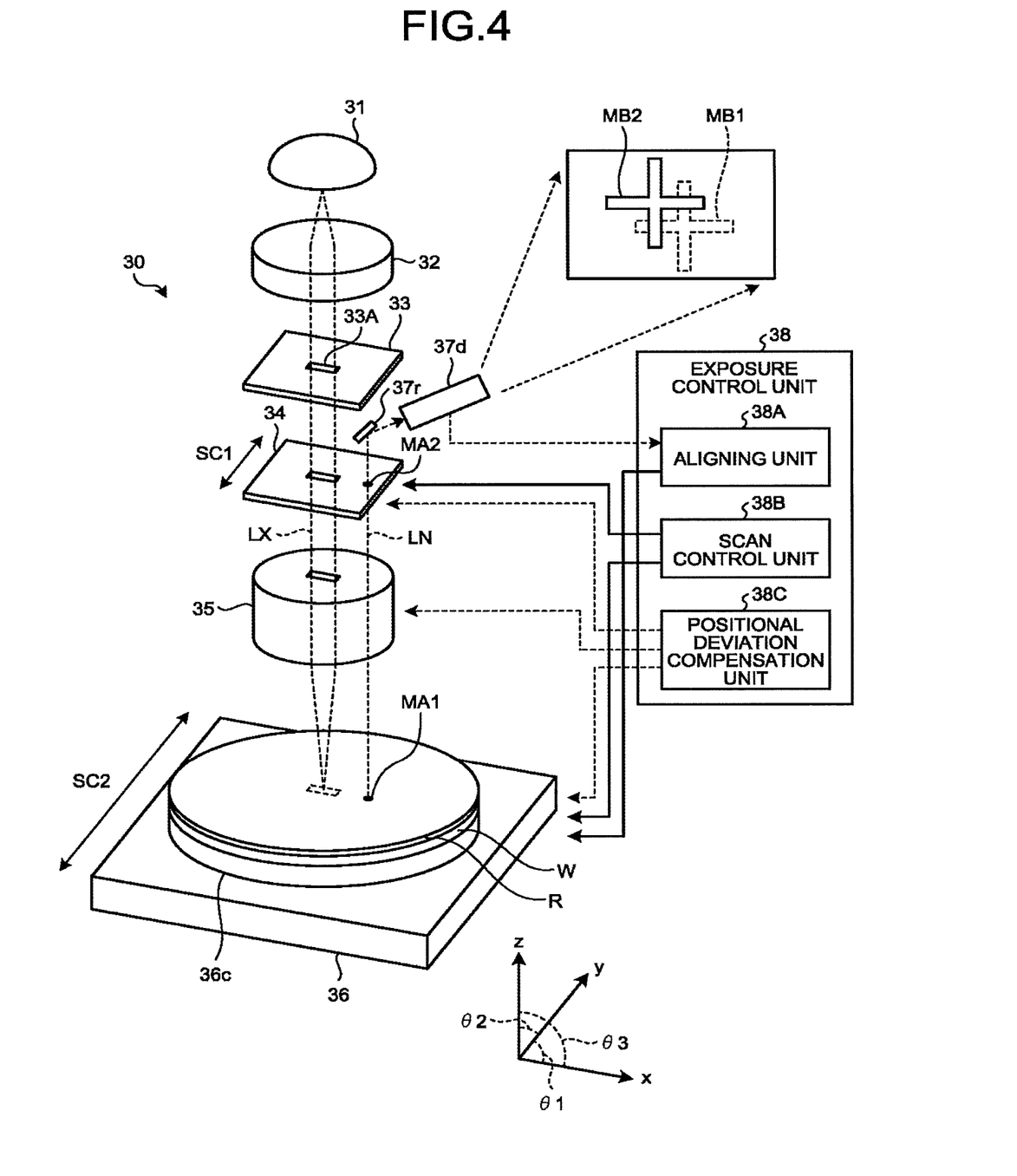
FIG. 4 is a perspective view illustrating a schematic configuration of a patterning device applied to the patterning support system according to the first embodiment.

Next, a configuration example of the patterning device 30 according to the first embodiment and an example of positional deviation correction in the patterning device 30 will be described with reference to FIG. 4. FIG. 4 is a perspective view illustrating a schematic configuration of the patterning device 30 applied to the patterning support system 1 according to the first embodiment.

As illustrated in FIG. 4, the patterning device 30 includes a light source 31 for emitting exposure light LX, an illumination lens 32 for irradiating a reticle 34 with the exposure light LX, a slit plate 33 for shaping the exposure light LX in a slit manner, a projection optical system 35 for projecting the exposure light LX having passed through the reticle 34 onto the wafer W, and a stage 36 on which a wafer W is placed. As the exposure light LX, ultraviolet light can be used, for example. A slit 33A is provided in the slit plate 33. The projection optical system 35 can change a magnification of a projection image to be projected on the wafer W. A chuck 36c for adsorbing the wafer W is provided on the stage 36. The stage 36 can be moved in an x-axis direction, a y-axis direction, and a z-axis direction. Further, the stage 36 can be rotated in a θ1 direction or can be tilted in a θ2 direction or in a θ3 direction.

An alignment mark MA1 is formed on the wafer W, and a resist film R is applied to the entire surface of the wafer W including the alignment mark MA1. An alignment mark MA2 is formed on the reticle 34.

Further, the patterning device 30 includes a reflection system 37r that reflects non-exposure light LN for observing the alignment marks MA1 and MA2, and an alignment detection system 37d that detects the alignment marks MA1 and MA2. As the non-exposure light LN, visible light or infrared light can be used, for example.

Further, the patterning device 30 includes an exposure control unit 38 that controls exposure to the resist film R on the wafer W. The exposure control unit 38 includes an aligning unit 38A, a scan control unit 38B, and a positional deviation compensation unit 38C.

The aligning unit 38A aligns the reticle 34 and the shot area on the basis of detection positions of the alignment marks MA1 and MA2. More specifically, the alignment detection system 37d generates mark images MB1 and MB2 respectively corresponding to the alignment marks MA1 and MA2, and sends the mark images MB1 and MB2 to the aligning unit 38A. The aligning unit 38A adjusts the position of the stage 36 to cause the mark images MB1 and MB2 to overlap with each other. Thereby, the reticle 34 and the shot area are aligned.

The scan control unit 38B performs scan control of the reticle 34 and the stage 36. At this time, the scan control unit 38B can synchronize scan SC1 of the reticle 34 with scan SC2 of the stage 36.

The positional deviation compensation unit 38C performs exposure control on the shot area on the basis of the position correction parameter from the host computer 90. At this time, the positional deviation compensation unit 38C can correct a parameter of an exposure condition for the shot area on the basis of the position correction parameter. The exposure condition can be selected from at least one of a scan speed of the stage 36 with respect to the reticle 34, an inclination of the stage 36 with respect to the reticle 34, a rotation angle of the stage 36 with respect to the reticle 34, and a magnification of a projection image to be projected on the wafer W. As a result, the position correction of the second pattern with respect to the first pattern of the wafer W can be performed.

(Configuration Example of Wafer)

Figure 5A:
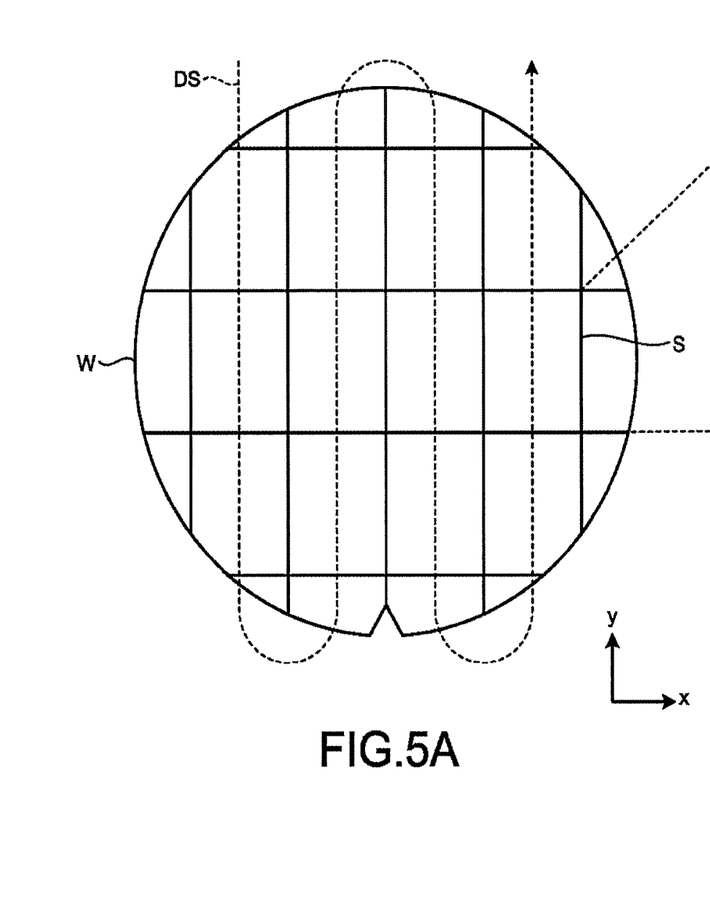
FIG. 5A is a plan view illustrating an arrangement example of a shot area of a wafer applied to the patterning support system according to the first embodiment.

Next, a configuration example of the wafer W to be patterned by the patterning support system 1 will be described with reference to FIGS. 5A to 5C and FIG. 6. FIG. 5A is a plan view illustrating an arrangement example of a shot area S of the wafer W applied to the patterning support system 1 according to the first embodiment, FIG. 5B is a plan view illustrating an arrangement example of a chip area C arranged in the shot area S, and FIG. 5C is a plan view illustrating an arrangement example of a pattern in the chip area C.

As illustrated in FIG. 5A, the wafer W to be patterned is divided into a plurality of shot areas S. The shot area S corresponds to a projection range of the pattern of the reticle 34 used in the patterning device 30. A scanning direction DS of the patterning device 30 is set so that all the shot areas S on the wafer W are sequentially exposed.

Figure 5B:
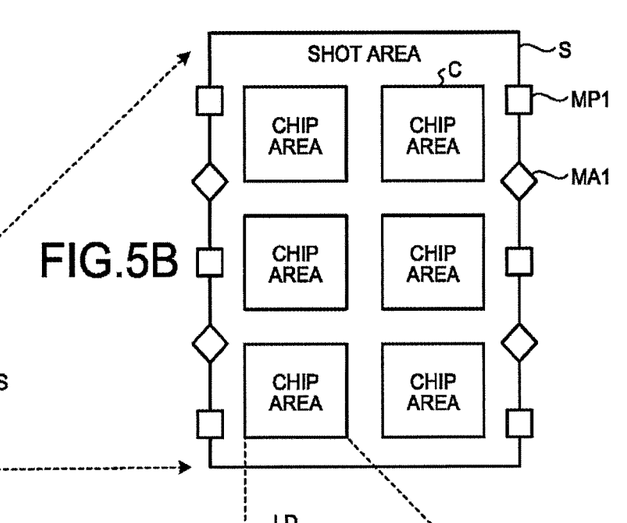
FIG. 5B is a plan view illustrating an arrangement example of a chip area arranged in the shot area of the wafer applied to the patterning support system according to the first embodiment.

As illustrated in FIG. 5B, the alignment mark MA1 and an overlay inspection mark MP1 are arranged around each shot area S. A plurality of chip areas C is arranged in each shot area S. FIG. 5B illustrates an example in which six chip areas C are arranged in one shot area S. However, any number of chip areas C can be arranged in one shot area S.

Figure 5C:
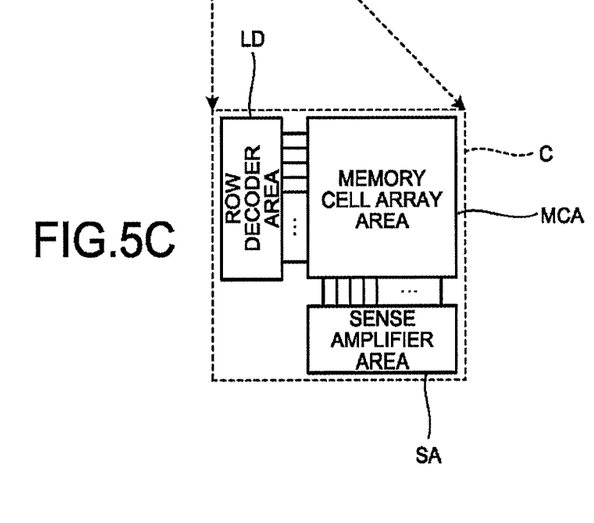
FIG. 5C is a plan view illustrating an arrangement example of a pattern in the chip area of the wafer applied to the patterning support system according to the first embodiment.

As illustrated in FIG. 5C, each chip area C is provided with a memory cell array area MCA as an element area, a row decoder area LD, and a sense amplifier area SA. An absolute position in the shot area S measured by the wafer absolute position measuring device 20 is, for example, the position of the memory cell array area MCA. A plurality of memory cells is three-dimensionally arranged in the memory cell array area MCA, for example. The row decoder area LD and the sense amplifier area SA function as a peripheral circuit contributing to an operation of the memory cells.

Figure 6:
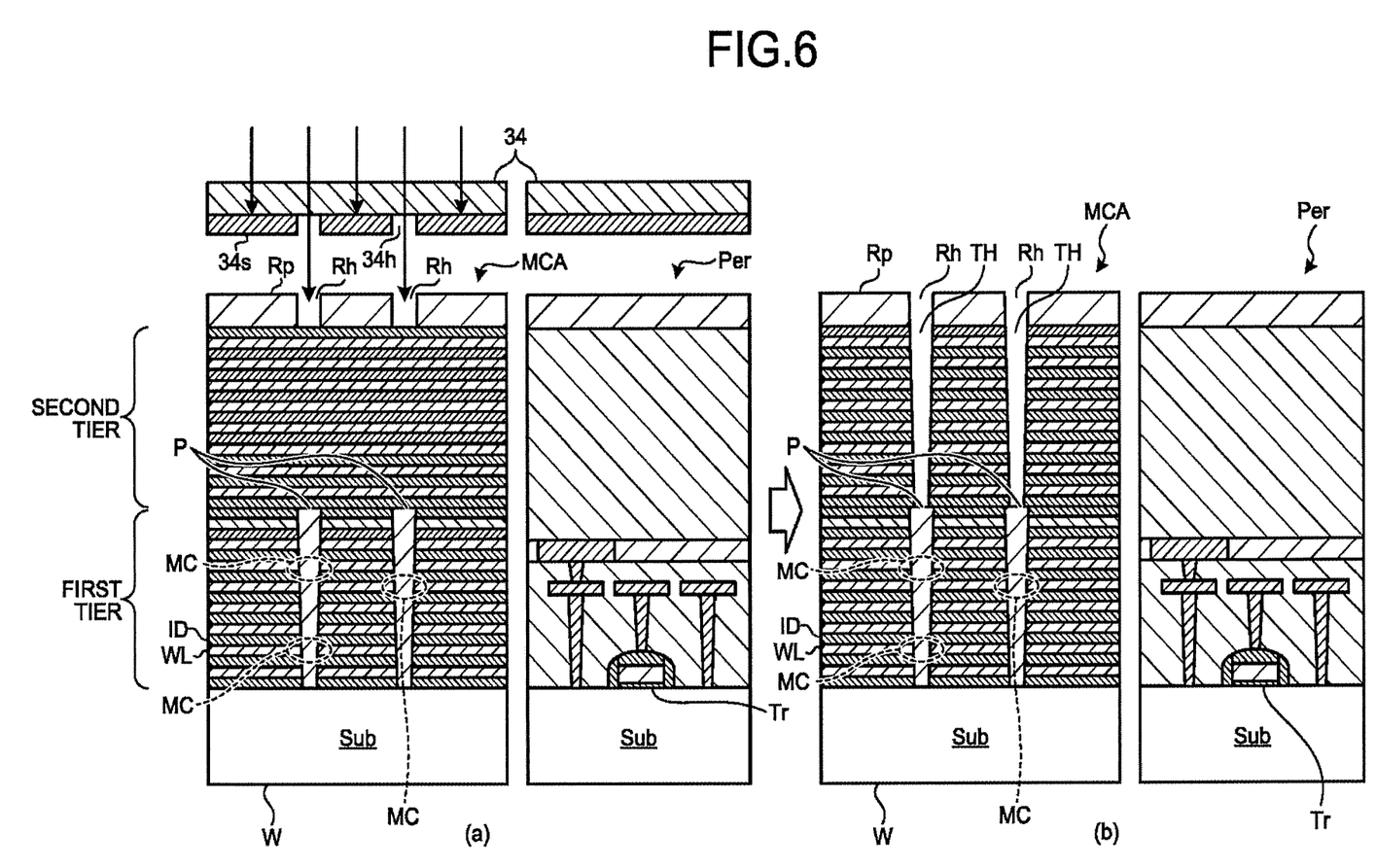
FIG. 6 is a cross-sectional view illustrating a state of patterning in a memory cell array area and a peripheral circuit of a wafer applied to the patterning support system according to the first embodiment.

FIG. 6 is a cross-sectional view illustrating a state of patterning in the memory cell array area MCA and a peripheral circuit Per of the wafer W applied to the patterning support system 1 according to the first embodiment. As illustrated in FIG. 6, the wafer W has a three-dimensional memory cell array MCA arranged on a semiconductor substrate Sub made of Si or the like. The peripheral circuit Per including a CMOS transistor Tr is arranged on the semiconductor substrate Sub made of Si or the like in the periphery of the memory cell array MCA.

A plurality of word lines WL and interlayer insulating layers ID is stacked and a pillar P penetrating the word lines WL and the interlayer insulating layers ID is provided in the memory cell array MCA. The pillar P includes a channel layer and a memory layer, whereby the memory cells MC are three-dimensionally arranged along a height direction of the pillar P. In the example of FIGS. 5A to 5C, the memory cell array MCA is formed in two tiers, and a through hole TH in which the channel layer and the memory layer will be buried to serve as the pillar P in the second tier is about to be formed.

That is, in accordance with the above example, the pattern formed in the first tier corresponds to the first pattern, and the pattern formed in the second tier corresponds to the second pattern overlayed on the first pattern. More specifically, the first pattern includes the memory cell array MCA, the alignment mark MA1 and the overlay inspection mark MP1 formed on a surface layer of the first tier, and the like. The second pattern is a resist pattern Rp to be described below. The resist pattern Rp includes a hole Rh in the memory cell array MCA, the alignment mark MA1 and the overlay inspection mark MP1 constituted by the resist pattern Rp, and the like.

As illustrated in FIG. 6(a), the resist pattern Rp having the hole Rh is formed in the second tier of the memory cell array MCA. The resist pattern Rp is formed by projecting and exposing a hole pattern 34h provided on a light shielding film 34s of the reticle 34. At this time, the hole pattern 34h of the reticle 34 needs to be aligned so that the hole Rh in the resist pattern Rp is formed right above the pillar P in the first tier.

Such alignment is realized in the patterning device 30 by the positional deviation compensation unit 38C correcting the parameter of the exposure condition on the basis of the position correction parameter from the host computer 90.

Alternatively, such alignment is realized in the reticle position revising device 50 by correcting the pattern position in the reticle 34 on the basis of the position correction parameter from the host computer 90 and attaching the reticle 34 to the patterning device 30 and exposing the reticle 34.

Alternatively, such alignment is realized in the reticle drawing device 60 by producing the reticle 34 on the basis of the position correction parameter from the host computer 90 and attaching the reticle 34 to the patterning device 30 and exposing the reticle 34.

Alternatively, such alignment is realized by executing a combination of some techniques from parameter correction of the exposure condition, reticle position revision, and reticle drawing based on the position correction parameter.

As illustrated in FIG. 6(b), through the position correction as described above, the through hole TH penetrating the word lines WL and the interlayer insulating layers ID in the second tier is formed right above the pillar P in the first tier, using the resist pattern Rp as a mask. By burying the channel layer and the memory layer in these through holes TH, the pillar P in the second tier is formed.

(Patterning Processing Example in Patterning Support System)

Figure 7:
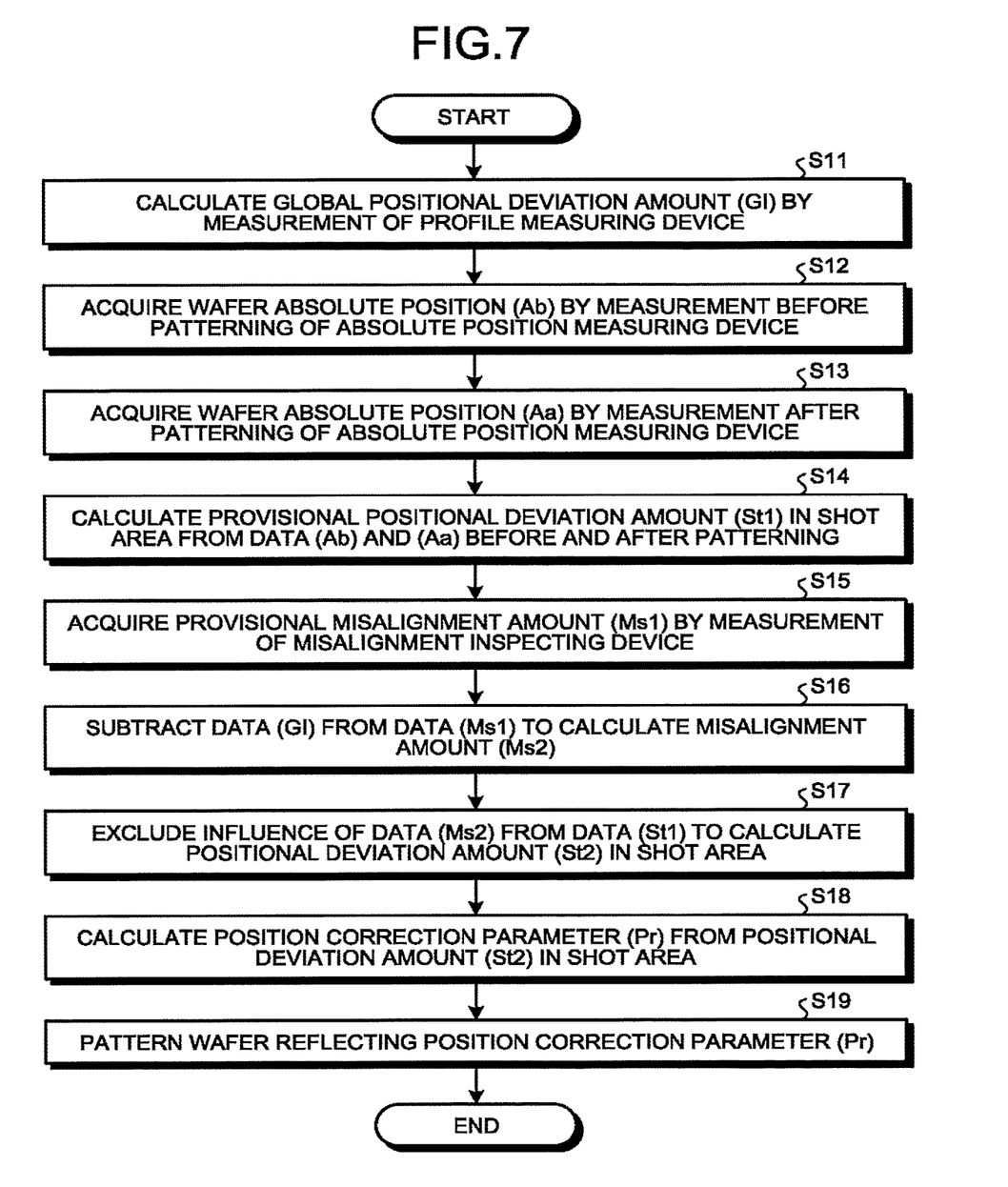
FIG. 7 is a flowchart illustrating an example of a procedure of patterning processing in the patterning support system according to the first embodiment.

Next, an example of patterning processing in the patterning support system 1 will be described with reference to FIG. 7. FIG. 7 is a flowchart illustrating an example of a procedure of patterning processing in the patterning support system 1 according to the first embodiment.

Here, assume that the wafer W to be patterned is the wafer W for which the patterning in the first tier in FIG. 6 has been completed and the resist film R has been formed in the second tier. In patterning the resist film R, position correction by the patterning support system 1 is applied.

As illustrated in FIG. 7, the wafer profile measuring device 10 measures the wafer W. The global positional deviation calculation unit 93 of the host computer 90 calculates the global positional deviation amount (Gl) of the wafer W from the data such as height distribution of the wafer surface, nanotopography of the wafer surface, stress distribution of the wafer surface, and the like measured by the wafer profile measuring device 10 (Step S11). At this time, the global positional deviation calculation unit 93 may exclude an influence of a foreign object, pattern defects of the wafer W, and the like, on the global positional deviation amount (Gl) by reference to the data of the foreign object inspecting device 70 and the wafer image acquiring device 80.

Next, the wafer absolute position measuring device 20 measures an absolute position (Abp) of the memory cell array MCA that is the first pattern in the shot area S of the wafer W before the resist pattern Rp as the second pattern is formed, and an absolute position (Abm) of the overlay inspection mark MP1 included in the shot area S (Step S12). A plurality of the absolute positions is measured over the entire surface of the wafer W. At this time, the absolute position (Abp) of the memory cell array MCA may be measured for each chip area C of the wafer W, and the absolute position (Abm) of the inspection mark MP1 may be measured for each shot area S of the wafer W.

Next, the wafer absolute position measuring device 20 measures an absolute position (Aap) of the memory cell array MCA indicated by the hole Rh in the resist pattern Rp after the resist pattern Rp formation, and an absolute position (Aam) of the overlay inspection mark MP1 included in the shot area S (Step S13). A plurality of the absolute positions is measured over the entire surface of the wafer W. At this time, the absolute position (Aap) of the memory cell array MCA may be measured for each chip area C of the wafer W, and the absolute position (Aam) of the inspection mark MP1 may be measured for each shot area S of the wafer W.

Next, the in-shot positional deviation calculation unit 95 of the host computer 90 subtracts the global positional deviation amount (Gl) from the absolute position (Abp) of the memory cell array MCA before the resist pattern Rp formation to obtain data (Sb). Further, the in-shot positional deviation calculation unit 95 subtracts the global positional deviation amount (Gl) from the absolute position (Aap) of the memory cell array MCA after the resist pattern Rp formation to obtain data (Sa). Further, the in-shot positional deviation calculation unit 95 obtains a difference between the data (Sb) and (Sa) and sets the difference as a provisional positional deviation amount (St1) in the shot area S (Step S14). At this time, the in-shot positional deviation calculation unit 95 may exclude the influence of a foreign object, pattern defects of the wafer W, and the like, on the provisional positional deviation amount (St1) in the shot area S by reference to the data of the foreign object inspecting device 70 and the wafer image acquiring device 80.

Further, the in-shot positional deviation calculation unit 95 subtracts the global positional deviation amount (Gl) from the absolute position (Abm) of the overlay inspection mark MP1 before the resist pattern Rp formation to obtain data (Sbm). Further, the in-shot positional deviation calculation unit 95 subtracts the global positional deviation amount (Gl) from the absolute position (Aam) of the overlay inspection mark MP1 after the resist pattern Rp formation to obtain data (Sam). Further, the in-shot positional deviation calculation unit 95 obtains a difference between the data (Sbm) and (Sam) and sets the difference as a mark positional deviation amount (Mk). At this time, the in-shot positional deviation calculation unit 95 may exclude the influence of a foreign object, pattern defects of the wafer W, and the like, on the mark positional deviation amount (Mk) by reference to the data of the foreign object inspecting device 70 and the wafer image acquiring device 80.

Next, the misalignment inspecting device 40 measures the wafer W after the resist pattern Rp formation. At this time, the misalignment inspecting device 40 detects the position of the overlay inspection mark MP1 formed at the time of patterning of the first tier and the position of the overlay inspection mark MP1 formed at the time of the resist pattern Rp formation of the second tier, and calculates the positional deviation amount between these inspection marks MP1. The positional deviation is caused by an error of a lens of the patterning device 30, for example. A plurality of the overlay inspection marks MP1 is measured over the entire surface of the wafer W, and thus a plurality of the positional deviation amounts is calculated. At this time, the overlay inspection mark MP1 may be measured for each shot area S of the wafer W.

The misalignment calculation unit 94 of the host computer 90 sets these positional deviation amounts as provisional misalignment amounts (Ms1) (Step S15). At this time, the misalignment calculation unit 94 may exclude the influence of a foreign object, pattern defects of the wafer W, and the like, on the provisional misalignment amount (Ms1) by reference to the data of the foreign object inspecting device 70 and the wafer image acquiring device 80.

Next, the misalignment calculation unit 94 subtracts the global positional deviation amount (Gl) from the plurality of provisional misalignment amounts (Ms1) to obtain formal misalignment amounts (Ms2) (Step S16). However, the positional deviation amount (Gl) is caused by warp of the wafer W or the like. Therefore, at a point not influenced by the global positional deviation, of the plurality of provisional misalignment amounts (Ms1), the misalignment amount (Ms1) can be used as is as the formal misalignment amount (Ms2) without subtracting the global positional deviation amount (Gl).

Next, the in-shot positional deviation calculation unit 95 checks the mark positional deviation amount (Mk) and the formal misalignment amount (Ms2), and assesses an influence of the misalignment amount (Ms2) in the absolute position measurement. Then, the in-shot positional deviation calculation unit 95 sets an amount obtained by excluding the influence of the misalignment amount (Ms2) from the provisional positional deviation amount (St1) in the shot area S as the formal positional deviation amount (St2) in the shot area S (Step S17).

As described above, the positional deviation amount (St2) in the shot area S is obtained by excluding the influence of the global positional deviation amount (Gl) and the misalignment amount (Ms2) from the absolute position measured by the wafer absolute position measuring device 20. In this manner, it is favorable that the positional deviation amount (St2) in the shot area S is calculated by excluding other factors as much as possible. Therefore, if there is another factor that may affect the positional deviation amount (St2) in the shot area S, the factor may be subtracted. For example, the influence of the positional deviation amount detected by the alignment detection system 37*d* of the patterning device 30 may be excluded.

Next, the correction parameter calculation unit 96 of the host computer 90 calculates the position correction parameter (Pr) from the formal positional deviation amount (St2) in the shot area S, using least squares approximation or Spline approximation (Step S18). Spline approximation is a method of approximating discrete data with an interval polynomial, that is, approximating data with a different function.

The host computer 90 transmits the position correction parameter (Pr) to at least one of the patterning device 30, the reticle position revising device 50, and the reticle drawing device 60 to reflect the position correction parameter (Pr) in the patterning for the wafer W (Step S19).

That is, the positional deviation compensation unit 38C of the patterning device 30 corrects the parameter of the exposure condition on the basis of the position correction parameter (Pr) and performs patterning for the next shot area S of the wafer W to be measured or for the next wafer W of the wafer W to be measured.

Alternatively, the reticle position revising device 50 revises the pattern position in the reticle 34 on the basis of the position correction parameter (Pr). By attaching the revised reticle 34 to the patterning device 30, patterning reflecting the position correction parameter is performed for the subsequent wafer W.

Alternatively, the reticle drawing device 60 produces the reticle 34 on the basis of the position correction parameter (Pr). By attaching the produced reticle 34 to the patterning device 30, patterning reflecting the position correction parameter is performed for the subsequent wafer W.

Alternatively, patterning for the wafer W is performed by combining some techniques from parameter correction of the exposure condition, reticle position revision, and reticle drawing based on the position correction parameter (Pr).

Thus, the patterning processing in the patterning support system 1 is terminated.

(Patterning of Comparative Example)

In a comparative example, positional deviation correction of a wafer using an alignment mark by an alignment detection system of a patterning device is performed. Such positional deviation correction merely matches a position of each shot area with a reticle position.

However, as in the case of having a memory cell array having a two-tier structure as illustrated in FIG. 6, high stacking of semiconductor devices is advanced, and an influence of stress is increased. In the periphery of the memory cell array, a peripheral circuit having a large constituent film difference is arranged, and a stress difference in the shot area is also large. As a result, there is a case where the positional deviation of a pattern occurs even within the shot area, for example. It is not possible to cope with such positional deviation by simply aligning the position of the shot area with the reticle position as in the comparative example.

The patterning support system 1 according to the first embodiment directly detects the absolute position of the pattern in the shot area S to detect the positional deviation by the wafer absolute position measuring device 20. As a result, the positional deviation of the pattern in the shot area S can be corrected with high accuracy.

Further, the patterning support system 1 according to the first embodiment excludes the influence of the global positional deviation from the positional deviation amount of the pattern in the shot area S, thereby calibrating the positional deviation of the pattern in the shot area S. As a result, the positional deviation of the pattern in the shot area S can be corrected with higher accuracy.

Further, the patterning support system 1 according to the first embodiment excludes the influence of the misalignment from the positional deviation amount of the pattern in the shot area S, thereby calibrating the positional deviation of the pattern in the shot area S. As a result, the positional deviation of the pattern in the shot area S can be corrected with higher accuracy.

Further, the patterning support system 1 according to the first embodiment detects a foreign object by the foreign object inspecting device 70 and detects pattern defects and the like by the wafer image acquiring device 80. Then, the patterning support system 1 excludes the influence of the foreign object and the pattern defects on the measurement results in the wafer absolute position measuring device 20, the wafer profile measuring device 10, the misalignment inspecting device 40, and the like. As a result, the positional deviation of the pattern in the shot area S can be corrected with higher accuracy.

In the patterning support system 1 according to the first embodiment, improvement of the alignment accuracy by 20% to 30% has been confirmed, as compared with the patterning according to the comparative example. This result is comparable to the alignment accuracy with respect to an unstacked flat wafer.

Second Embodiment

Next, a patterning support system of a second embodiment will be described with reference to FIG. 8. The patterning support system according to the second embodiment is different from the patterning support system 1 according to the first embodiment in that a patterning device is an imprint device.

The patterning support system according to the second embodiment includes an imprint device as the patterning device. Further, the patterning support system according to the second embodiment includes a template position revising device, in place of the reticle position revising device 50 in the first embodiment. Further, the patterning support system according to the second embodiment includes a template drawing device, in place of the reticle drawing device 60 in the first embodiment.

The template position revising device revises a pattern position of a template as an original used in the imprint device. The pattern position of the template is revised by locally irradiating the template with laser to locally distort the template, for example. At this time, the template position revising device receives a position correction parameter from a host computer of the second embodiment, and revises the pattern position on the basis of the position correction parameter.

The template drawing device is a device that produces a master template to serve as an original of the template. The template drawing device draws on a glass substrate with an electron beam or the like to produce the master template. At this time, the template drawing device receives the position correction parameter from the host computer of the second embodiment, and draws the master template on the basis of the position correction parameter. From the master template thus produced, a template to be used for patterning on a wafer is further produced.

Figure 8:
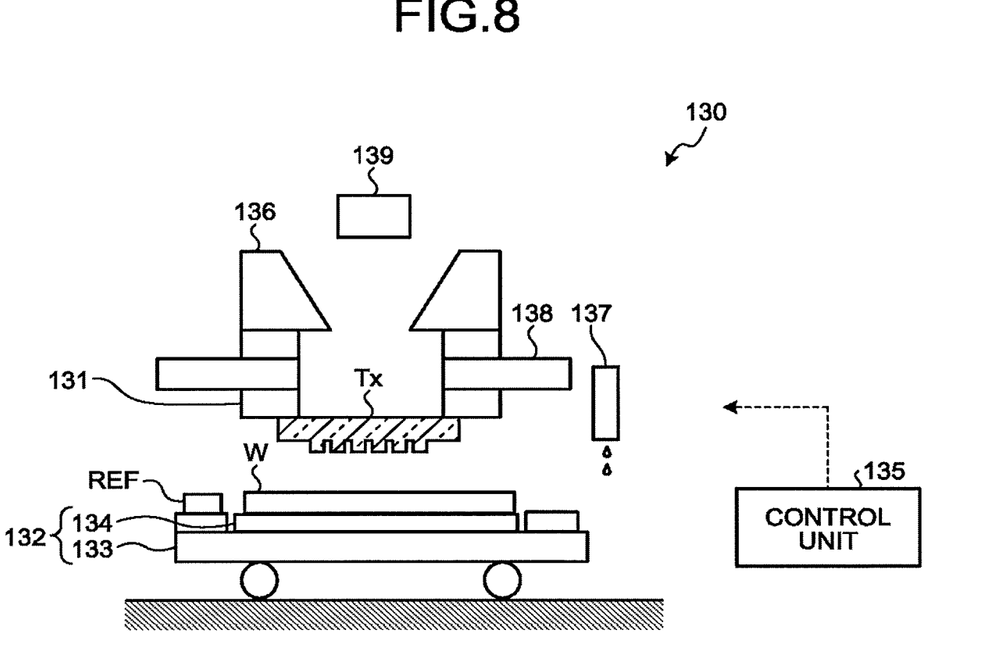
FIG. 8 is a schematic diagram illustrating a schematic configuration of a patterning device applied to a patterning support system according to a second embodiment.

FIG. 8 is a schematic diagram illustrating a schematic configuration of a patterning device 130 applied to a patterning support system according to the second embodiment. As illustrated in FIG. 8, the patterning device 130 includes a template stage 131, a placing table 132, a reference mark REF, an alignment unit 136, a liquid dropping device 137, a stage base 138, a light source 139, and a control unit 135.

The placing table 132 includes a wafer chuck 134 and a main body 133. The wafer chuck 134 fixes a wafer W at a predetermined position on the main body 133. The reference mark REF is provided on the placing table 132. The reference mark REF is used for alignment when the wafer W is loaded onto the placing table 132.

The placing table 132 has the wafer W placed and moves within a plane (in a horizontal plane) parallel to the placed wafer W. The placing table 132 moves the wafer W to a lower side of the liquid dropping device 137 when dropping a resist onto the wafer W, and moves the wafer W to a lower side of a template Tx when performing transfer processing for the wafer W.

The template Tx is an original used for nanoimprint lithography, for example. A template pattern is three-dimensionally formed on a lower surface side of the template Tx.

The stage base 138 supports the template Tx by the template stage 131 and moves in an up-down direction (vertical direction), thereby pressing the template pattern of the template Tx against the resist on the wafer W.

The alignment unit 136 is provided on the stage base 138. The alignment unit 136 includes, for example, a microscope (not illustrated), and detects the position of the wafer W and the position of the template Tx.

The liquid dropping device 137 is a device for dropping a resist onto the wafer W by an inkjet method. An inkjet head of the liquid dropping device 137 has a plurality of fine holes for jetting droplets of the resist, and drops dot-like resists (droplets) onto the wafer W.

The light source 139 is a device that radiates ultraviolet rays, for example, and is provided above the stage base 138. The light source 139 radiates light from above the template Tx in a state where the template Tx is pressed against the resist.

The control unit 135 controls the template stage 131, the placing table 132, the reference mark REF, the alignment unit 136, the liquid dropping device 137, the stage base 138, and the light source 139.

In imprint processing in the patterning device 130 configured as described above, the template Tx is pressed against a photo-curing resist film to fill a recessed portion of the template Tx with the resist film, then the resist film is irradiated with ultraviolet light to cure, and then the template Tx is released. Thereby, the resist film is patterned.

The template Tx with a revised pattern position revised by the template position revising device is attached to the patterning device 130, or the template Tx produced from the master template of the template drawing device is attached to the patterning device 130, whereby the patterning reflecting the position correction parameter can be performed on the wafer W.

The patterning support system according to the second embodiment has similar effects to the effects of the above-described first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A patterning support system applied to patterning of dividing a substrate into a plurality of shot areas and transferring a pattern from an original to the substrate for each of the shot areas, the patterning support system comprising:

an absolute position measuring device that measures absolute positions with respect to absolute coordinates, of a first pattern formed in the shot area of the substrate and a second pattern to be transferred to the substrate while being overlayed on the first pattern;

a substrate profile measuring device that measures a global positional deviation amount of the substrate;

a misalignment inspecting device that measures a misalignment amount of the second pattern with respect to the first pattern;

a correction executing device that corrects the position of the second pattern with respect to the first pattern; and a control device that calibrates the absolute positions measured by the absolute position measuring device, using the global positional deviation amount and the misalignment amount, and converts the calibrated absolute positions into a position correction parameter to be used when the position of the second pattern is corrected by the correction executing device, wherein the control device:

to calibrate a positional deviation amount between the first pattern and the second pattern in the shot area by excluding an influence of at least one of a foreign object detected by a foreign object inspecting device or a pattern defect on the substrate detected by a substrate image acquiring device, the foreign object inspecting device detecting a foreign object on the substrate and the substrate image acquiring device acquiring a front surface image of the substrate, corrects at least one of results of measurement by the absolute position measuring device, the substrate profile measuring device, and the misalignment inspecting device using at least one of results of detection by the foreign object inspecting device and by the substrate image acquiring device;

to calibrate the positional deviation amount between the first pattern and the second pattern in the shot area by excluding an influence of the global positional deviation amount, subtracts the global positional deviation amount from the absolute position of the substrate before the second pattern is formed to obtain first data, subtracts the global positional deviation amount from the absolute position of the substrate after the second pattern is formed to obtain second data, and calculates a difference between the first data and the second data and sets the difference as a provisional positional deviation amount between the first pattern and the second pattern in the shot area; and to calibrate the positional deviation amount between the first pattern and the second pattern in the shot area by excluding an influence of the misalignment amount, sets the misalignment amount measured by the misalignment inspecting device as a provisional misalignment amount and subtracts the global positional deviation amount from the provisional misalignment amount to obtain a formal misalignment amount, and subtracts the formal misalignment amount from the provisional positional deviation amount between the first pattern and the second pattern in the shot area to obtain a formal positional deviation amount between the first pattern and the second pattern in the shot area.

2. The patterning support system according to claim 1, wherein
the control device converts the formal positional deviation amount between the first pattern and the second pattern in the shot area into the position correction parameter.

3. The patterning support system according to claim 1, wherein
the absolute position measuring device
measures a pattern position in an element area as the absolute position.

4. The patterning support system according to claim 1, wherein
the control device
calculates the position correction parameter for each of the shot areas.

5. The patterning support system according to claim 1, wherein
the control device
calculates the position correction parameter, using least squares approximation or Spline approximation.

6. The patterning support system according to claim 1, wherein
the correction executing device is at least one of
a patterning device that transfers the pattern of the original to the substrate for each shot area,
an original position revising device that revises a pattern position in the original, and
an original drawing device that produces the original.

7. A patterning method of dividing a substrate into a plurality of shot areas and transferring a pattern from an original to the substrate for each of the shot areas, the patterning method comprising:
acquiring absolute positions with respect to absolute coordinates, of a first pattern formed in the shot area of the substrate and a second pattern to be transferred to the substrate while being overlayed on the first pattern;
acquiring a global positional deviation amount of the substrate and a misalignment amount of the second pattern with respect to the first pattern;
calibrating the acquired absolute positions, using the global positional deviation amount and the misalignment amount, and converting the calibrated absolute positions into a position correction parameter, and
correcting the position of the second pattern with respect to the first pattern on the basis of the position correction parameter, wherein
the calibrating the absolute positions includes:
to calibrate a positional deviation amount between the first pattern and the second pattern in the shot area by excluding an influence of at least one of a foreign object detected or a pattern defect on the substrate,
correcting at least one of the acquired absolute positions, the acquired global positional deviation, or the acquired misalignment amount using at least one of a foreign object detected or a pattern defect detected;
to calibrate the positional deviation amount between the first pattern and the second pattern in the shot area by excluding an influence of the global positional deviation amount,
subtracting the global positional deviation amount from the absolute position of the substrate before the second pattern is formed to obtain first data,
subtracting the global positional deviation amount from the absolute position of the substrate after the second pattern is formed to obtain second data, and
calculating a difference between the first data and the second data and setting the difference as a provisional positional deviation amount between the first pattern and the second pattern in the shot area; and
to calibrate the positional deviation amount between the first pattern and the second pattern in the shot area by excluding an influence of the misalignment amount,
setting the misalignment amount of the second pattern with respect to the first pattern as a provisional misalignment amount and subtracting the global positional deviation amount from the provisional misalignment amount to obtain a formal misalignment amount, and
subtracting the formal misalignment amount from the provisional positional deviation amount between the first pattern and the second pattern in the shot area to obtain a formal positional deviation amount between the first pattern and the second pattern in the shot area.

8. The patterning method according to claim 7, wherein
the converting the absolute positions into the position correction parameter includes converting the formal positional deviation amount between the first pattern and the second pattern in the shot area into the position correction parameter.

9. The patterning method according to claim 7, wherein
the acquiring the absolute positions with respect to the absolute coordinates includes acquiring a pattern position in an element area as the absolute position.

10. The patterning method according to claim 7, wherein
the acquiring the absolute positions with respect to the absolute coordinates includes calculating the position correction parameter for each of the shot areas.

11. The patterning method according to claim 7, wherein
the converting the absolute positions into the position correction parameter includes calculating the position correction parameter, using least squares approximation or Spline approximation.

12. A computer-readable nonvolatile recording medium storing a program to be executed by a patterning support system to be applied to patterning of dividing a substrate into a plurality of shot areas and transferring a pattern from an original to the substrate for each of the shot areas, the program for causing the patterning support system to execute:
acquiring absolute positions with respect to absolute coordinates, of a first pattern formed in the shot area of the substrate and a second pattern to be transferred to the substrate while being overlayed on the first pattern;
acquiring a global positional deviation amount of the substrate and a misalignment amount of the second pattern with respect to the first pattern;
calibrating the acquired absolute positions, using the global positional deviation amount and the misalignment amount, and converting the calibrated absolute positions into a position correction parameter; and
correcting the position of the second pattern with respect to the first pattern on the basis of the position correction parameter, wherein
the calibrating the absolute positions includes:
to calibrate a positional deviation amount between the first pattern and the second pattern in the shot area by excluding an influence of at least one of a foreign object detected or a pattern defect on the substrate,
correcting at least one of the acquired absolute positions, the acquired global positional deviation, or the acquired misalignment amount using at least one of a foreign object detected or a pattern defect detected;

to calibrate the positional deviation amount between the first pattern and the second pattern in the shot area by excluding an influence of the global positional deviation amount,
- subtracting the global positional deviation amount from the absolute position of the substrate before the second pattern is formed to obtain first data,
- subtracting the global positional deviation amount from the absolute position of the substrate after the second pattern is formed to obtain second data, and
- calculating a difference between the first data and the second data and setting the difference as a provisional positional deviation amount between the first pattern and the second pattern in the shot area; and to calibrate the positional deviation amount between the first pattern and the second pattern in the shot area by excluding an influence of the misalignment amount,
- setting the misalignment amount of the second pattern with respect to the first pattern as a provisional misalignment amount and subtracting the global positional deviation amount from the provisional misalignment amount to obtain a formal misalignment amount, and
- subtracting the formal misalignment amount from the provisional positional deviation amount between the first pattern and the second pattern in the shot area to obtain a formal positional deviation amount between the first pattern and the second pattern in the shot area.

13. The nonvolatile recording medium according to claim 12, wherein the converting the absolute positions into the position correction parameter includes converting the formal positional deviation amount between the first pattern and the second pattern in the shot area into the position correction parameter.

14. The nonvolatile recording medium according to claim 12, wherein the acquiring the absolute positions with respect to the absolute coordinates includes
acquiring a pattern position in an element area as the absolute position.

15. The nonvolatile recording medium according to claim 12, wherein the acquiring the absolute positions with respect to the absolute coordinates includes
calculating the position correction parameter for each of the shot areas.

16. The nonvolatile recording medium according to claim 12, wherein the converting the absolute positions into the position correction parameter includes
calculating the position correction parameter, using least squares approximation or Spline approximation.

* * * * *